United States Patent [19]
Chin et al.

[11] Patent Number: 5,830,619
[45] Date of Patent: Nov. 3, 1998

[54] RESIST MATERIALS

[75] Inventors: Evelyn Chin, Scotch Plains; Francis Michael Houlihan, Millington; Omkaram Nalamasu, Basking Ridge, all of N.J.

[73] Assignee: Lucent Technologies Inc., Murray Hills, N.J.

[21] Appl. No.: 777,008

[22] Filed: Jan. 7, 1997

Related U.S. Application Data

[60] Continuation of Ser. No. 468,212, Jun. 6, 1995, abandoned, which is a division of Ser. No. 79,310, Jun. 17, 1993.

[51] Int. Cl.$^6$ .................................................. G03F 7/004
[52] U.S. Cl. .......................... 430/270.1; 430/5; 430/313; 430/326; 558/44; 558/58
[58] Field of Search ........................... 558/58, 44; 430/5, 430/270.1, 313, 326

[56] References Cited

U.S. PATENT DOCUMENTS

| | | | |
|---|---|---|---|
| 4,996,136 | 2/1991 | Houlilhan et al. | 430/313 |
| 5,135,838 | 8/1992 | Houlihan et al. | 430/326 |
| 5,200,544 | 4/1993 | Houlihan et al. | 558/44 |

FOREIGN PATENT DOCUMENTS

| | | | |
|---|---|---|---|
| 0 330 386 | 8/1989 | European Pat. Off. | G06F 7/02 |
| 4-13725 | 1/1992 | Japan | C08G 77/26 |

OTHER PUBLICATIONS

Loudon et al., J. Chem. Soc., 1959, 1780–2.
"Substituent Constants for Correlation Analysis in Chemistry and Biology", Hansch, C. et al., *Steric Effects in Organic Chemistry*, pp. 559–675 (1956).
"The Upsilon Steric Parameter", *Steric Effects in Drug Design*, pp. 58–91 (1983).
"Electrical Effect Substituent Contents for Correlation Analysis", *Progress in Physical Organic Chemistry*, vol. 13, pp. 119–247 (1981).
"N–alkanesulfonamide Dianions: Formation and Chemoselective C–Alkylationa", M. E. Thompson, *J. Org. Chem.*, 49, pp. 1700–1703, (1984).
"Chemical Amplification Mechanisms for Microlithography", Reichmanis, E. et al., *Chemisty of Materials* (1991), 3, pp. 394.
"Chemical Amplification Mechanisms for Microlithography", by Reichmanis, E. et al.

*Primary Examiner*—Johann Richter
*Assistant Examiner*—Laura L. Stockton
*Attorney, Agent, or Firm*—Scott J. Rittman

[57] ABSTRACT

Photoacid generators advantageous for use in applications such as photoacid generators used in chemically amplified resists are disclosed. These compounds are based on an ortho nitro benzyl configuration employing an α substituent having high bulk, steric characteristics, and electron withdrawing ability. The enhanced efficacy is particularly found in compounds both having a suitable α substituent and a second ortho substituent with large electron withdrawing and steric effects.

3 Claims, 1 Drawing Sheet

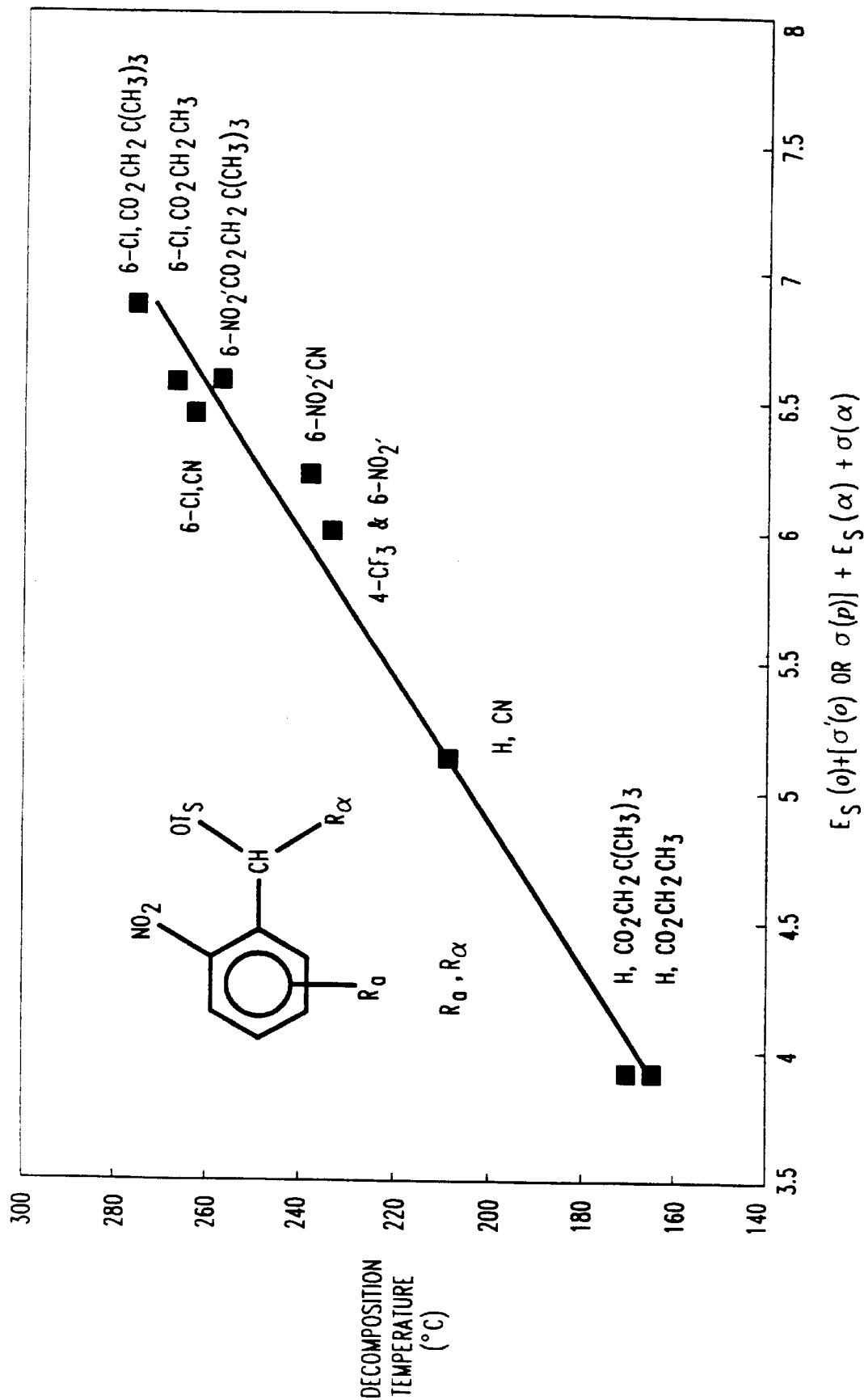

RESIST MATERIALS

This application is a continuation of application Ser. No. 08/468212, filed on Jun. 6, 1995, now abandoned, which a divisional application of Ser. No. 08/079310, filed on Jun. 17, 1993, pending.

BACKGROUND OF THE INVENTION

1. Field of the Invention

This invention relates to lithographic processes, and, in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to form a plurality of devices. The coating material, i.e., the resist, is then subjected to light that has been passed through a mask material so that the light reaching the resist produces an image that, after development, yields a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with methods such as electron lithography.

Improved resolution with a blanket exposure is achievable by using deep ultraviolet light. One such approach involves a photoresist sensitive to deep ultraviolet radiation containing a compound that produces an acid moiety upon irradiation with such radiation together with a polymer that reacts with the generated acid. Typical acid generator/acid sensitive polymer combinations include an onium salt as the photosensitive acid generator and a polymer such as poly (p-t-butoxycarbonyloxystyrene) as the polymer having a reactive substituent.

The use of an inorganic salt such as the onium salt as the acid generator is not entirely desirable. There is a possibility of contamination of the device being processed by inorganic ionic species from the salt Additionally, ionic acid generators also have the tendency to phase separate from the acid sensitive resin. Therefore, organic acid generators having reasonable sensitivity to deep ultraviolet light for use in a photoresist are quite desirable.

An organic photoacid generator based on ortho nitrobenzyl esters has been disclosed in U.S. Pat. No. 5,135,838, issued Aug. 4, 1992. These photoacid generators do not present the difficulties associated with inorganic salts and have shown excellent properties for use in applications such as chemically amplified resists. Despite the excellent qualities of these photoacid generators, improvement is always desirable.

SUMMARY OF THE INVENTION

A photoacid generator with higher decomposition temperatures allow higher post-exposure baked temperatures that accelerate the rate of photoinduced reaction. Thus, through the use of such higher temperatures, sensitivity of the resist material is enhanced. The thermal stability of nitrobenzyl esters as photoacid generators and, therefore, their sensitivity is increased by employing an α-substituent on the moiety positioned ortho to the nitro group. In particular, structures represented by the formula:

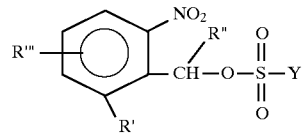

where R' is hydrogen or a substituent that enhances steric and/or electronic interaction with the α-substituted substituent R", and where R" is a substituent that has appropriate steric and/or electronic characteristics and where R''', if present, is not critical but is exemplified by substituents such as lower alkyl, e.g., $CF_3$, aryl, $NO_2$, Cl, and organosulfonyl. Exemplary substituents for R" include $CO_2Et$, $COCH_3$, CN, and organosulfonyl, while appropriate substituents for R' include H, $NO_2$, Cl, $CF_3$, alkyl, aryl, and organosulfonyl. Exemplary substituents for Y are alkyls such as lower alkyl, e.g., methyl and trifluoroethyl, aryl such as phenyl or phenyl substituted with R' or R'''. Further substitution is possible provided the substituent is not acidic and is not excessively absorbing of ultraviolet light.

The resulting photoacid generators have decomposition temperatures in the range 164° to 276° C. as compared to a range of 124° to 224° C. for the corresponding materials without an α-substituent. Table 1 gives a comparison between the thermal stabilities with and without stabilizing α-substituents.

TABLE 1

Thermal decomposition temperature ($T_{min}$) of α-substituted 2-nitrobenzyl tosylate (Ts) or 1,3-benzenedisulfonate (Bis) PAG derivatives.

| $R_a$, | $R_\alpha$, | $R_b$ | Temperature of decomposition temperature of PAG's ($T_{min}$) °C. | Temperature of decomposition temperature for PAG's ($T_{min}$) with $R_\alpha$ = H °C. |
|---|---|---|---|---|
| 4-$CF_3$ & 6-$NO_2$, | $COCH_3$, | Ts | 235 | 224 |
| H, | CN, | Ts | 211 | 124 |
| 6-$NO_2$, | CN, | Ts | 238 | 204 |
| 6-Cl, | CN, | Ts | 265 | 218 |
| H, | $CO_2CH_2CH_3$, | Ts | 164 | 124 |
| H, | $CO_2CH_2C(CH_3)_3$, | Ts | 168 | 124 |
| 6-$NO_2$, | $CO_2CH_2CH_3$, | Ts | 261 | 204 |
| 6-$NO_2$, | $CO_2CH_2C(CH_3)_3$, | Ts | 267 | 204 |
| 6-Cl, | $CO_2CH_2CH_3$, | Ts | 276 | 218 |
| 6-Cl, | $CO_2CH_2C(CH_3)_3$, | Ts | 276 | 218 |
| 6-$NO_2$, | $CO_2CH_2CH_3$, | Bis | 215 | 176 |
| 6-$NO_2$ | $CO_2CH_2C(CH_3)_3$, | Bis | 217 | 176 |
| 6-Cl, | $CO_2CH_2C(CH_3)_3$, | Bis | 232 | 190 |
| 6-Cl, | CN, | Bis | 232 | 190 |

The higher thermal stability of these materials permits higher post-exposure bake temperatures resulting in enhanced sensitivity without resolution loss for small features. Although the inventive photoacid generating materials are particularly useful in photolithographic processes for device fabrication, they are also sensitive to electrons and x-rays. Therefore, exposure with such sources is not precluded.

BRIEF DESCRIPTION OF THE DRAWINGS

The FIGURE is illustrative of how substituent groups of the composition of the present invention can be selected to attain a desired relative thermal stability.

DETAILED DESCRIPTION

For typical acid sensitive polymers having one acid reactive substituent per monomer unit, acid generator concentrations in the range 0.5 to 50 weight percent, preferably 1 to 20 weight percent, are desirable. Concentrations of photosensitive acid generators less than 0.5 weight percent, although not precluded, are not desirable because resolution and sensitivity are degraded. Concentrations greater than 50 weight percent are undesirable because excessive acid generation tends to produce poor image quality.

As discussed, the photoresists such as a chemically amplified photoresist should employ an organic photoacid generator represented by the formula

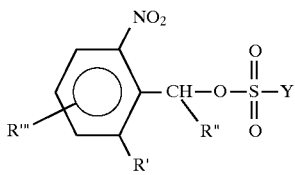

where R' is a substituent that has an appropriately steric bulk and/or electron withdrawing characteristic, where R" is an α-substituent containing steric bulk hindrance and/or inductive electron withdrawing ability, and where R''', if present, is not critical but is exemplified by substituents such as aryl, alkyl, $CF_3$, $NO_2$, Cl and organosulfonyl.

Substituents that are characteristic of the R' moiety include H, $NO_2$, $CF_3$, Cl, alkyl, organosulfonyl, and aryl. Additional substitution on the aromatic ring generally does not affect properties and is not precluded. However, further substituents that are acidic, e.g., that have a $pK_a$ lower than 5, should be avoided since they tend to enhance degradation.

Thermal stability is also enhanced by choosing an R" that has appropriate electronic characteristics. The degree of electronic interaction is determined for direct attachment of a substituent as discussed in *Steric Effects in Organic Chemistry*, Melvin S. Newman, New York, 559 (1956). As defined in this reference, these values may be readily calculated from the σ* for $CH_2$—X which measures the electronic effect with an intervening $CH_2$ group. Generally, it is desirable to have a σ* (—X) of at least 1.5. Thus, even in the absence of a second ortho substituent, (i.e., R'=H) with COR, $CO_2R$, SOR, CN, $SO_2R$ for R" thermal stabilities as high as 210° C. can be achieved for tosylate esters.

Enhancement of thermal stability is also possible by choosing an R" that has appropriate steric characteristics. In particular, the factor used for measuring the steric hindrance is the Charton steric parameter. Such parameters are compiled in texts such as C. Hansch and A. Leo, *Substituents Constants for Correlation Analysis in Chemistry and Biology*, Wiley Interscience (1979). Generally, it is desirable that the Charton steric parameter for R" be greater than 0.4.

The improved effect associated with employing an α-substituent (steric or electronic) is further enhanced by using a suitable ortho substituent R'. Two factors that affect this enhancement are the steric hindrance of R' and the degree of electron withdrawing characteristic. As discussed in U.S. Pat. Nos. 5,135,838 and 5,200,544 (both of which are incorporated by reference), these two factors are interrelated. The greater the steric hindrance and the greater the electron withdrawing characteristic, generally the higher the decomposition temperature relative to the corresponding nitrobenzyl ester compound in the absence of an R' substituent. The same considerations discussed in the Houlihan patent and patent application supra, concerning the steric effects are applicable to R'. Exemplary of useful R' substituents are alkyl, $NO_2$, $CF_3$, organosulfonyl, aryl, and Cl.

Even further enhancement is achieved by using α-substituent whose steric bulk has a conformational dependence that can be increased through coulombic repulsion with an electronegative R' substituent. Thus, for example, in using an alkoxycarbonyl substituent for R", two orientations of this substituent are possible, $\upsilon_{min}$ (0.50) and $\upsilon_{max}$ (1.45) which respectively minimize and maximize steric interaction to the ortho nitro group that attacks during thermal decomposition. ($\upsilon_{min}$ and $\upsilon_{max}$ are defined in "Upsilon Steric Parameter-Definition and Determination", in *Steric Effects in Drug Design*, M. Charton and I. Motoc, Eds., Springer-Verlag, New York, p. 57 (1983).) Normally, in the absence of an electronegative R' group, the conformation offering minimal steric interaction is preferred. However, if an electronegative R' group is present, then coulombic repulsions forces the R" substituent to adopt the conformation offering larger steric interaction. To induce this increased steric bulk, R" should, as previously discussed, be chosen to have a σ* (—X) of at least 1.5 and a Charton steric parameter of greater than 0.40. Other examples of R" which offer a similar combination of a coulombic effect coupled with a large conformational steric dependence are carbonyl esters, $NO_2$, $CO_2$, amides, and $COCF_3$. In general, these substituents should be chosen to be planar π bounded groups in which either conformation offering $\sigma_{min}$ to an attacking nitro group causes a coulombic repulsion due to an electronegative moiety.

Increasing thermal stability is accomplished by decreasing the tendency of the sulfonate to undergo nucleophilic reaction by the oxygen of the nitro group. As a result, the increase in thermal stability is accompanied by an increased resistance to solvolysis, hydrolysis, and reactions with other nucleophilic moieties present during processing. Taking into account the above discussion concerning steric, electronic, and coulombic effects of R' and R" and possible resonance effects of the R" substituent, an empirical plot allowing guidance in choosing an acid generator with a desired relative thermal stability is achievable (FIG. 1). This is accomplished by calculating σ(α) constants incorporating both resonance and inductive effects. The calculation uses as its basis literature values of $\sigma_R$ and $\sigma_I$ calculated by Charton for attachment of substituents at an aromatic ring. *Progress in Physical Organic Chemistry*, M. Charton in *Electrical Effect Substituent Constants For Correlation Analysis*, Editor R. W. Taft, Interscience Publication, John Wiley & Sons, New York (1981) p. 119.

Also, an estimate is made of combined resonance, inductive effects for α-substituents by defining the following: $\sigma(\alpha)=(\sigma_R/\sigma_I)\sigma^*(\alpha)+\sigma^*(\alpha)$. This resonance interaction is a function of the overlap of the π orbitals of the α-substituent with that of σ of the benzyl carbon as it undergoes nucleophilic interaction with the oxygen atom of the attacking vicinal nitro group.

Apart from improving thermal stability, it is possible to use α-substituents to improve other properties of the photoacid generator. For instance, for α-alkoxycarbonyl groups, (i.e., R"=$CO_2R$, where R is an alkyl moiety), increasing the size of the alkyl group from ethyl to noepentyl greatly improves the solubility in certain less polar spinning solvents such as 3-ethylethoxypropionate. Also, it is possible to introduce moieties such as a dissolution inhibitor removable through acidolytic cleavage by using an appropriately substituted α-substituent. For example, in the case of R"=CO₂R, when R=t-butyl or t-amyl, thermal stability is improved relative to that over presently available acid generators through introduction of similar groups at the 2-nitroaryl moiety in compounds such as 4-butoxycarbonyl-2,6-dinitrobenzyl tosylate (i.e., >150° C.) such as described by F. M. Houlihan, E. Chin, O. Nalamasu, and J. M. Kometani in *Proc. Polym. Mater. Sci. Eng.*, 66, 38 (1992).

It is possible to synthesize photoacid generators involved in the invention by a variety of routes. For example, one route involves

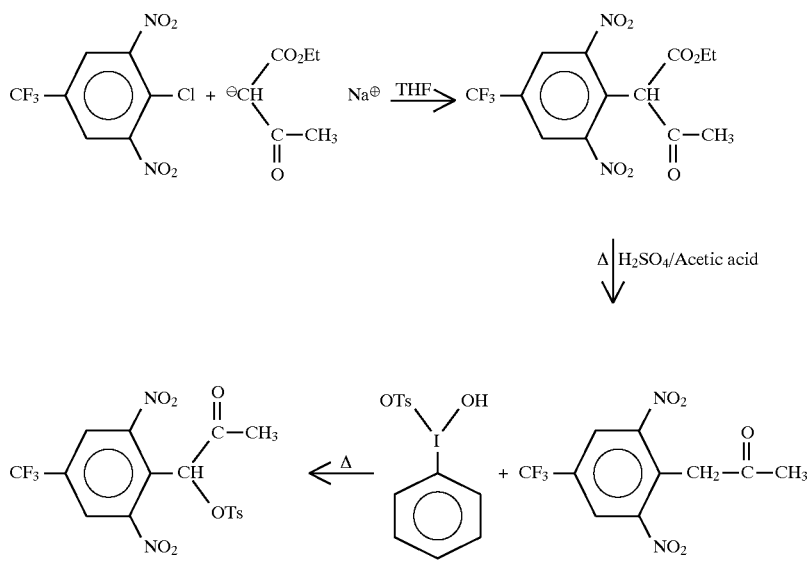

An alternate route involves

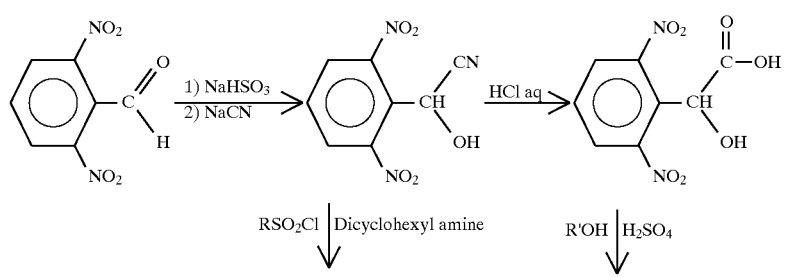

-continued
Scheme 2

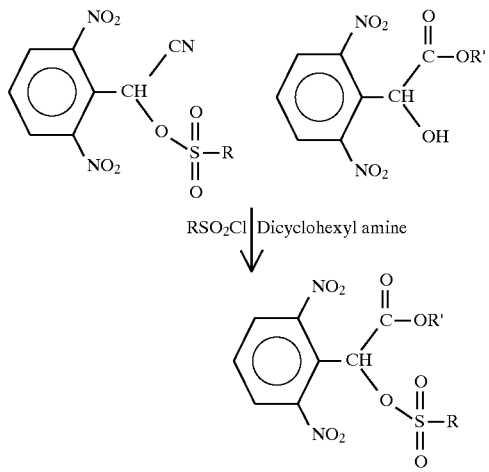

Additionally, a third suitable route includes the steps of

Scheme 3

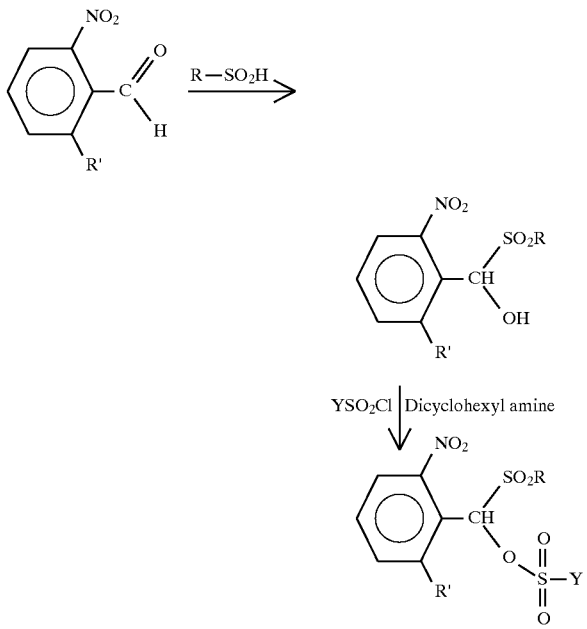

The following examples are illustrative of suitable processes for synthesizing the acid generators and for use in the invention.

EXAMPLE 1:

Synthesis of α-substituted photoacid generators (PAG's)

Synthesis of 2,6-dinitromandelonitrile

A saturated solution of sodium bisulfite (126 mL) was added to a suspension of 2,6-dinitrobenzaldehyde (30 g, 152.0 mmol) in water (300 mL). This mixture was allowed to stir for 2 hours after which time almost all solids dissolved. The fine particles remaining were filtered off. A sodium cyanide solution (45 g NaCN>180 mL $H_2O$) was then dropped into the filtered solution. The precipitate formed was filtered and washed with cold water giving a yield of 28 g (82%).

Synthesis of 2,6-dinitromandelic acid 2,6-dinitromandelonitrile (28.0 g, 126 mmol) was dissolved in 428 mL of concentrated HCl. This mixture was heated at reflux for 5 hours. It was then cooled, poured into ice, extracted with ether and dried over $MgSO_4$. The ether layer was filtered and concentrated to 100 mL. Carbon tetrachloride was added to the ether layer. The resulting precipitate was collected to give a yield of 22 g (72%).

Synthesis of neopentyl 2,6-dinitromandelate 2,6-dinitromandelic acid (4.00 g, 16.5 mmol) was added to an excess of neopentyl alcohol (20.0 g, 227 mmol) melted in a round bottom flask. To this solution was added 5 drops of $H_2SO_4$ and it was heated to reflux for 3 hours. The excess neopentyl alcohol was removed under reduced pressure, and the residue was purified by column chromatography over silica gel (60–200 mesh) using methylene chloride/hexane (1:1) as the eluant. The yield after two recrystallizations from $CHCl_3$/petroleum ether was 3.8 g (74%).

Synthesis of α-(neopentoxycarbonyl)-2,6-dinitrobenzyl tosylate

Neopentyl 2,6-dinitromandelate (1.50 g, 4.80 mmol) and p-toluenesulfonyl chloride (1.00 g, 5.28 mmol) were mixed in dry acetone (50 mL) under argon. Dicyclohexylamine (0.957 g, 5.28 mmol) was added slowly to the reaction at 0° C. The mixture was stirred at room temperature for 2 hours at which time the reaction was shown to be complete by thin-layer chromatography (tlc). The acetone was then removed by evaporation under vacuum. The residue was put through a silica gel (60–200 mesh) column using methylene chloride/hexane (1:1) as the eluant. Recrystallization from $CHCl_3$/petroleum ether gave a yield of 2 g (89%).

Synthesis of bis[α-(neopentoxycarbonyl)-2,6-dinitrobenzyl] 1,3-benzenedisulfonate A solution consisting of 1,3-benzenedisulfonyl chloride (0.544 g, 1.98 mmol) and the alcohol (1.24 g, 3.96 mmol) was prepared under nitrogen in dry acetone (15 mL). Dicyclohexylamine (0.58 g, 3.96 mmol) diluted with acetone (10 mL) was added slowly to the reaction mixture at 0° C. which was then stirred for 1 hour. The dicyclohexylamine hydrochloride salt was filtered off and the acetone solution was concentrated under vacuum until most of the solvent was removed. The residue was purified by column chromatography over silica gel (60–200 mesh) using $CH_2Cl_2$/hexane (1:1) as the eluant. Recrystallization from $CHCl_3$/petroleum ether gave a yield of 1.24 g (76%).

Synthesis of α-(ethoxycarbonyl)-α'-(acetyl)-4-(trifluoromethyl)-2,6-dinitrotoluene Sodium hydride (1.77 g, 73.9 mmol) was placed in a suspension in dry freshly distilled THF (20 mL) under argon. Ethyl acetoacetate (9.62 g, 73.9 mmol) was introduced slowly cooling the stirred reaction mixture with an ice bath during addition. When $H_2$ ceased to evolve, 4-chloro-3,5-dinitrobenzotrifluoride (10.00 g, 36.96 mmol) dissolved in THF (20 mL) was added slowly to the reaction mixture and it was allowed to stir for 2 hours. The THF solution was washed with dilute $H_2SO_4$ (10%) until acidic to pH paper then dried over $MgSO_4$, filtered, and concentrated under vacuum until most of the solvent was removed. The residue was put through a column of silica gel (60–200 mesh) using $CH_2Cl_2$/hexane (1:1) as the eluant. Recrystallization with ethanol/petroleum ether gave a yield of 4.7 g (35%).

Synthesis of α-(acetyl)4-(trifluoromethyl)-2,6-dinitrotoluene

α-(Ethoxycarbonyl)-α'-(methylcarbonyl)-4-(trifluoromethyl)-2,6-dinitrotoluene (1.00 g, 2.74 mmol) was refluxed with 50% acetic acid (22 mL), concentrated $H_2SO_4$ (45 drops) for 12 hours. The reaction was cooled to room temperature and the precipitate that formed was filtered and washed with petroleum ether. The yield was 0.73 g (91%).

Synthesis of α-(acetyl)4-(trifluoromethyl)-2,6-dinitrobenzyl tosylate

α-(Acetyl)4-(trifluoromethyl)-2,6-dinitrotoluene (5.00 g, 17.10 mmol) was heated to 80° C. for 10 minutes under nitrogen. Hydroxy(tosyloxy) iodobenzene (13.40 g, 34.18 mmol) was then added slowly keeping the temperature constant at 80° C. The reaction mixture was allowed to stir for 1 hour, carefully avoiding overheating. After cooling, the reaction mixture was purified by column chromatography over silica gel (60–200 mesh) using $CH_2Cl_2$/hexane (1:1) as the eluant. Recrystallization with chloroform/petroleum ether gave 2 g (25%) of pure product.

EXAMPLE 2:

Lithographic Evaluation

Exposures were done using a Laserstep® prototype deep-UV exposure tool (NA=0.35, 5×optics) operating at 248 nm.

The photoresist solutions for the initial screening of PAG's derivatized as the tosylates were prepared and processed as follows: Poly(4-(t-butoxycarbonyloxy)styrenesulfone) (3:1, $M_W$=150,000, D=1.9) PTBOCSS (4 g) and a α-substituted-2-nitrobenzyl ester (6.0 mole % relative to the polymer's pendant t-BOC groups) were dissolved in 1,2-dimethoxyethane (24 mL). The solutions were filtered through a series of 1.0, 0.5, and 0.2 μm Teflon filters (Millipore Inc.). For comparison, a photoresist solution was prepared in the same way with 2,6-dinitrobenzyltosylate as the PAG component. Photoresist films were spin coated (2,300 r.p.m.) onto hexamethyldisilazane vapor primed silicon substrates, and prebaked at 105° C. for 60 s. After exposure, the substrates were post-exposure baked at 115° C. for 30 s. Development was done in 0.17N tetramethylammonium hydroxide (TMAH) for 30 s. The results are summarized in Table 2.

TABLE 2

Lithographic Sensitivity[a] of Resists Formulated with PTBOCSS and α-Substituted Tosylate (Ts) PAG's.

| $R_a$, | $R_\alpha$ | Lithographic Sensitivity mJ/cm$^2$ | λ max nm | ε max Liter mole$^{-1}$cm$^{-1}$ | ε 248 Liter mole$^{-1}$cm$^{-1}$ | Φ 248 |
|---|---|---|---|---|---|---|
| 4-CF$_3$ & 6-NO$_2$, | COCH$_3$ | 50 | 222 | 25,700 | 9,300 | 0.11 |
| 6-NO$_2$, | CN | 130 | 229 | 25,700 | 9,900 | 0.04 |
| 6-NO$_2$, | CO$_2$CH$_2$CH$_3$ | 56 | 228 | 27,900 | 12,000 | 0.08 |
| 6-NO$_2$, | CO$_2$CH$_2$C(CH$_3$)$_3$ | 66 | 227 | 28,500 | 12,000 | 0.07 |
| 6-NO$_2$, | H | 30 | 227 | 25,700 | 9,300 | 0.16 |
| 6-CF$_3$, | H | 110 | 221 | 28,520 | 5,100 | 0.11 |

[a]For preparation and processing of resists see the experimental lithographic section, first procedure.

The photoresist solutions for the secondary screening of PAG's derivatized as the tosylates or the 1,3-benzenedisulfonates were prepared and processed in the same way as described above except that resists in which the loading of α-substituted ester was decreased to 2.5 mole % were also prepared. For comparison, resist solutions with 2-(trifluoromethyl)-6-nitrobenzyl tosylate, and bis(2-(trifluoromethyl)-6-nitrobenzyl) 1,3-benzenedisulfonate were prepared at the same molar loading of PAG and processed as described above. The lithographic results are given in Table 3.

TABLE 3

Absorbance and lithographic[a] behavior of resists formulated with PTBOCSS and α-substituted tosylate (Ts) or 1,3-benzenedisulfonates (Bis) PAG derivatives.

| $R_a$, | $R_\alpha$, | $R_b$ | PAG | PAG mole % | PEB Temperature °C. | Absorbance AU/μm | PEB Time seconds | Lithographic Sensitivity mJ/cm$^2$ | Dose needed to achieve given equal lines and spaces resolution. mJ/cm$^2$ | (μm) line/space pairs |
|---|---|---|---|---|---|---|---|---|---|---|
| 6-NO$_2$, | H | | Ts | 6.0 | 115 | 0.44 | 30 | 30 | 80 | (0.40) |
| 6-CF$_3$, | H | | Ts | 6.0 | 115 | 0.23 | 30 | 110 | 210 | (0.60) |
| 6-NO$_2$, | CO$_2$CH$_2$C(CH$_3$)$_3$, | | Ts | 6.0 | 115 | 0.44 | 30 | 66 | 170 | (0.50) |
| 6-CF$_3$, | H | | Bis | 6.0 | 115 | 0.40 | 30 | 14 | 30 | (0.35) |
| 6-NO$_2$, | CO$_2$CH$_2$CH$_3$, | | Bis | 6.0 | 115 | 0.70 | 30 | 22 | 44 | (0.50) |
| 6-NO$_2$, | CO$_2$CH$_2$C(CH$_3$)$_3$, | | Bis | 6.0 | 115 | 0.68 | 30 | 24 | 60 | (0.50) |
| 6-NO$_2$, | CO$_2$CH$_2$CH$_3$, | | Bis | 2.5 | 115 | 0.41 | 30 | 80 | >100[c] | (0.50) |
| 6-NO$_2$, | CO$_2$CH$_2$CH$_3$, | | Bis | 2.5 | 125 | 0.41 | 30 | 40 | 66 | (0.50) |
| 6-NO$_2$, | CO$_2$CH$_2$C(CH$_3$)$_3$, | | Bis | 2.5 | 115 | 0.37 | 30 | 90 | >100 | (0.50) |
| 6-NO$_2$, | CO$_2$CH$_2$C(CH$_3$)$_3$, | | Bis | 2.5 | 125 | 0.37 | 30 | 38 | 76 | (0.50) |
| 6-NO$_2$, | H | | Bis | 2.5 | 115 | 0.25 | 30 | 85 | >100 | (0.50) |
| 6-NO$_2$, | H | | Bis | 2.5 | 125 | 0.25 | 30 | 30 | 65 | (0.50) |

[a]For preparation and processing of resists see the experimental lithographic section, second procedure.
b) The line thickness increases going towards the substrate and some residue is observed in the spaces.
[c]No effort was made to determine the resolution dose or resolution capability when doses >100 mJ/cm$^2$ were required for resolution.

Final testing was done with resist solutions formulated with Poly(4-(t-butoxycarbonyloxy)styrene-4-(acetoxy)styrene-sulfone), (1.8:1.2:1, $M_W$=105,000, D=1.6–1.7) PTBOCSASS (4 g) and various α-alkoxycarbonyl-2,6-dinitrobenzyl 1,3-benzendisulfonates (2.5 and 1.5% mole loading) dissolved in diglyme (24 mL). Preexposure baked was done as before, while postexposure bake temperature and time Were varied as described in Table 4, parts 1–3.

TABLE 4

Absorbance and lithographic[a] behavior of resists formulated with PTBOCSASS and α-substituted 1,3-benzenedisulfonates (Bis) PAG derivatives.

| $R_a$, | $R_\alpha$, | $R_b$ | PAG | PAG mole % | PEB Temperature °C. | Absorbance AU/μm | PEB Time seconds | Lithographic Sensitivity mJ/cm$^2$ | Dose needed to achieve given equal lines and spaces resolution. mJ/cm$^2$ | (μm) line/space pairs |
|---|---|---|---|---|---|---|---|---|---|---|
| | | | | | | part 1 | | | | |
| 6-CF$_3$, | H | | Bis | 2.5 | 115 | 0.37 | 30 | 92 | >100[c] | (0.35) |
| 6-CF$_3$, | H | | Bis | 2.5 | 115 | 0.37 | 60 | 62 | >100 | (0.35) |
| 6-CF$_3$, | H | | Bis | 2.5 | 125 | 0.37 | 60 | 46 | lost[b] | (0.35) |
| 6-CF$_3$, | H | | Bis | 2.5 | 135 | 0.37 | 60 | 30 | lost | (0.35) |
| 6-CF$_3$, | H | | Bis | 1.5 | 115 | 0.29 | 30 | >100 | >100 | (0.35) |
| 6-CF$_3$, | H | | Bis | 1.5 | 115 | 0.29 | 60 | >100 | >100 | (0.35) |
| 6-CF$_3$, | H | | Bis | 1.5 | 125 | 0.29 | 60 | 72 | lost | (0.35) |

TABLE 4-continued

Absorbance and lithographic[a] behavior of resists formulated with PTBOCSASS and α-substituted 1,3-benzenedisulfonates (Bis) PAG derivatives.

| $R_a$, | $R_\alpha$, | $R_b$ | PAG mole % | PEB Temperature °C. | Absorbance AU/μm | PEB Time seconds | Lithographic Sensitivity mJ/cm$^2$ | Dose needed to achieve given equal lines and spaces resolution. mJ/cm$^2$ | (μm) line/space pairs |
|---|---|---|---|---|---|---|---|---|---|
| 6-CF$_3$, | H | Bis | 1.5 | 135 | 0.29 | 60 | 46 | lost | (0.35) |
| | | | | part 2 | | | | | |
| 6-NO$_2$, | CO$_2$CH$_2$CH$_3$, | Bis | 2.5 | 115 | 0.51 | 30 | 92 | >100[c] | (0.35) |
| 6-NO$_2$, | CO$_2$CH$_2$CH$_3$, | Bis | 2.5 | 115 | 0.51 | 60 | 68 | >100 | (0.35) |
| 6-NO$_2$, | CO$_2$CH$_2$CH$_3$, | Bis | 2.5 | 125 | 0.51 | 60 | 44 | 92 | (0.35) |
| 6-NO$_2$, | CO$_2$CH$_2$CH$_3$, | Bis | 2.5 | 135 | 0.51 | 60 | 28 | 54 | (0.35)[b] |
| 6-NO$_2$, | CO$_2$CH$_2$CH$_3$, | Bis | 1.5 | 115 | 0.43 | 30 | >100 | >100 | (0.35) |
| 6-NO$_2$, | CO$_2$CH$_2$CH$_3$, | Bis | 1.5 | 115 | 0.43 | 60 | >100 | >100 | (0.35) |
| 6-NO$_2$, | CO$_2$CH$_2$CH$_3$, | Bis | 1.5 | 125 | 0.43 | 60 | 66 | >100 | (0.35) |
| 6-NO$_2$, | CO$_2$CH$_2$CH$_3$, | Bis | 1.5 | 135 | 0.43 | 60 | 40 | 90 | (0.35)[b] |
| | | | | part 3 | | | | | |
| 6-NO$_2$, | CO$_2$CH$_2$C(CH$_3$)$_3$, | Bis | 2.5 | 115 | 0.50 | 30 | >100 | >100[c] | (0.35) |
| 6-NO$_2$, | CO$_2$CH$_2$C(CH$_3$)$_3$, | Bis | 2.5 | 115 | 0.50 | 60 | 76 | >100 | (0.35) |
| 6-NO$_2$, | CO$_2$CH$_2$C(CH$_3$)$_3$, | Bis | 2.5 | 125 | 0.50 | 60 | 54 | 98 | (0.35) |
| 6-NO$_2$, | CO$_2$CH$_2$C(CH$_3$)$_3$, | Bis | 2.5 | 135 | 0.50 | 60 | 34 | 62 | (0.35)[b] |
| 6-NO$_2$, | CO$_2$CH$_2$C(CH$_3$)$_3$, | Bis | 1.5 | 115 | 0.34 | 30 | >100 | >100 | (0.35) |
| 6-NO$_2$, | CO$_2$CH$_2$C(CH$_3$)$_3$, | Bis | 1.5 | 115 | 0.34 | 60 | >100 | >100 | (0.35) |
| 6-NO$_2$, | CO$_2$CH$_2$C(CH$_3$)$_3$, | Bis | 1.5 | 125 | 0.34 | 60 | 70 | >100 | (0.35) |
| 6-NO$_2$, | CO$_2$CH$_2$C(CH$_3$)$_3$, | Bis | 1.5 | 135 | 0.34 | 60 | 54 | 98 | (0.35)[b] |

[a]For preparation and processing of resists see the experimental lithographic section, third procedure.
[b]Lines show profile degradation resulting in inverted line profiles.
[c]No effort was made to determine the resolution dose or resolution capability when doses >100 mJ/cm$^2$ were required for resolution.

Development was done in 0.26N TMAH for 60 s. Resist solutions formulated with bis(2-(trifluoromethyl)-6-nitrobenzyl) 1,3-benzenesulfonate were also prepared and evaluated as above.

All thickness measurements were obtained on a Nanospec film thickness gauge (Nanometrics, Inc.) or a Dektak model IIA profilometer. Scanning electron (SEM) cross-sections were obtained on a JEOL scanning electron microscope.

We claim:

1. A resist composition comprising:
   a material that undergoes a reaction in response to an acidic moiety; and
   an acid generating material represented by the formula:

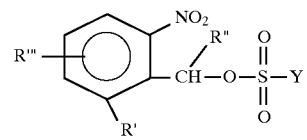

wherein R''' is optional and, if present, has a p$K_a$ of 5 or greater, Y is a member chosen from the group consisting of alkyls and aryls, R'' has a σ* of at least 1.5, and R' is chosen from the group consisting of H, $NO_2$, Cl, $CF_3$, alkyl, aryl, and organosulfonyls.

2. The resist composition of claim 1 wherein R''' is chosen from the group consisting of $CF_3$, $NO_2$, alkyl, aryl, Cl, and organosulfonyls.

3. The resist composition of claim 1 wherein R" is chosen from the group consisting of $CO_2Et$, $COCH_3$, CN, and organosulfonyls.

* * * * *